(12) United States Patent
Zeng et al.

(10) Patent No.: US 10,117,334 B2
(45) Date of Patent: Oct. 30, 2018

(54) MAGNETIC ASSEMBLY

(71) Applicant: Delta Electronics (Shanghai) Co., Ltd., Shanghai (CN)

(72) Inventors: Jianhong Zeng, Shanghai (CN); Shouyu Hong, Shanghai (CN); Min Zhou, Shanghai (CN)

(73) Assignee: DELTA ELECTRONICS (SHANGHAI) CO., LTD., Shanghai (CN)

(*) Notice: Subject to any disclaimer, the term of this patent is extended or adjusted under 35 U.S.C. 154(b) by 78 days.

(21) Appl. No.: 15/158,016

(22) Filed: May 18, 2016

(65) Prior Publication Data

US 2017/0256346 A1 Sep. 7, 2017

(30) Foreign Application Priority Data

Mar. 3, 2016 (CN) .......................... 2016 1 0120906

(51) Int. Cl.
| | |
|---|---|
| *H01F 5/00* | (2006.01) |
| *H01F 27/28* | (2006.01) |
| *H05K 1/18* | (2006.01) |
| *H05K 1/16* | (2006.01) |
| *H01F 3/14* | (2006.01) |
| *H01F 17/00* | (2006.01) |

(Continued)

(52) U.S. Cl.
CPC ............. *H05K 1/181* (2013.01); *H01F 3/14* (2013.01); *H01F 17/0013* (2013.01); *H01F 17/06* (2013.01); *H05K 1/165* (2013.01); *H05K 1/186* (2013.01); *H05K 3/284* (2013.01); *Y02P 70/611* (2015.11)

(58) Field of Classification Search
CPC .................................... H01F 5/00; H01F 27/28
USPC .................................................. 336/200, 232
See application file for complete search history.

(56) References Cited

U.S. PATENT DOCUMENTS

| | | | | |
|---|---|---|---|---|
| 4,117,588 A | * | 10/1978 | Johnson .................. | H01F 41/02 156/89.12 |
| 6,713,162 B2 | * | 3/2004 | Takaya .................. | H03H 7/0115 428/209 |

(Continued)

FOREIGN PATENT DOCUMENTS

| | | |
|---|---|---|
| CN | 103430256 A | 12/2013 |
| CN | 103943306 A | 7/2014 |

(Continued)

*Primary Examiner* — Tsz Chan
(74) *Attorney, Agent, or Firm* — Kirton McConkie; Evan R. Witt

(57) ABSTRACT

A magnetic assembly is disclosed. The magnetic assembly includes a first magnetic core, a second magnetic core and a first series winding. The first magnetic core has a first top surface, a first bottom surface, a first sidewall, a second sidewall, at least one first sidewall through-hole and at least one second sidewall through-hole. The second magnetic core is connected to the first top surface of the first magnetic core. The first series winding has a first upper winding set, a first sidewall winding set, and a second sidewall winding set disposed on the first top surface, the first sidewall and the second sidewall respectively. The upper winding set is connected to the lower winding set via the first sidewall winding set and the second sidewall winding set is further connected to the lower winding set, so as to form the first series winding around the first magnetic core.

23 Claims, 23 Drawing Sheets

(51) Int. Cl.
  *H01F 17/06* (2006.01)
  *H05K 3/28* (2006.01)

(56) References Cited

U.S. PATENT DOCUMENTS

| | | | |
|---|---|---|---|
| 7,864,017 B2* | 1/2011 | Fujiwara | H01F 17/0013 336/200 |
| 2008/0303624 A1* | 12/2008 | Yamada | H01F 3/14 336/212 |
| 2010/0225434 A1 | 9/2010 | Wang et al. | |
| 2016/0155559 A1* | 6/2016 | Chiu | H01L 23/49822 336/200 |

FOREIGN PATENT DOCUMENTS

| | | | |
|---|---|---|---|
| CN | 204884757 U | | 12/2015 |
| JP | 05109556 A | * | 4/1993 |
| WO | 2014093884 A1 | | 6/2014 |

* cited by examiner

MAGNETIC ASSEMBLY

FIELD OF THE INVENTION

The present invention relates to a magnetic assembly, and more particularly to an optimized magnetic assembly and a power module using the same.

BACKGROUND OF THE INVENTION

With the increasing requests of human intelligent life, the increasing requirements of developing intelligent products, and the growing of Internet of Things (IoT), the requirements of data transmission and processing are increasing day by day. In a centralized data processing center, servers are key elements and have motherboards including CPU, chipsets, and memories, such as digital chips for data processing with power supplies and necessary peripheral elements. For increasing the processing capacity of servers in a unit volume, the number of digital chips and the density of integration are increased correspondingly. Consequently, the ratio of occupied space and power loss are increased. Therefore, the power supply (also called as motherboard power due to that the power supply and the digital chips are disposed on the same motherboard) employed by the system for providing power to the digital chips is expected to have higher efficiency, higher power density and smaller occupied space, so as to facilitate the entire server and even the entire data center to save energy and minimize the occupied area.

Generally, the power with the low voltage and the large current is provided to the digital chips mentioned above. For reducing the influences of power loss and impedance of the output wire, power supplies which are capable of providing power to the digital chips directly are disposed on the motherboard and located as close as possible to the digital chips. Therefore, the power supply which is capable of providing power to the digital chips directly is called as a point of the load (POL) power supply. The above-mentioned power supply has an input power provided from other power source. The typical POL power supply has an input voltage about 12 volts.

On the other hand, for achieving the applications in a distributed portable data processing terminal, the constituent elements and the digital chips have to be integrated into a small space and keep working for a long time. In addition, lower operating voltage is provided to the constituent elements and the digital chips. Generally, the lower operating voltage is provided by an energy storage device such as 3V to 5V battery. Therefore, the power supply tends to be requested with a high efficiency and a high power density.

At present, in a low-voltage DC/DC converter, a buck converter is usually employed to provide various output voltages ranged from 0 volt to 5 volts for the corresponding digital chips. FIG. 1 shows a circuit diagram of a typical buck converter. As shown in FIG. 1, the buck converter includes an input filter capacitor Cin, a main switching element Q1, an auxiliary switching element Q2, an inductor L and an output capacitor Co. The input filter capacitor Cin is electrically connected with a power source for receiving an input voltage Vin. The main switching element Q1 performs a turn-on and turn-off operation to adjust the output voltage Vo and the output current Io. The output current Io of the buck converter is provided to a load RL, i.e. the digital chip or a CUP.

However, in the above circuit, the ratio of the power loss and the occupied space of the inductor L to that of the entire converter is high. It is considered an important prerequisite to provide a magnetic assembly with high efficiency and high space utilization in order to achieve the purpose of optimizing the system with high efficiency and high powder density. At present, iron powder core, low temperature co-fired ceramic (LTCC) core or ferrite core is employed in the typical inductor. However, the inductor with iron powder core has higher power loss and is not suitable to be implemented in high-efficiency applications. Due to the limitation of the lamination process, the thickness of the metallic winding layer is thin, and the circulating capacity is limited. Consequently, the inductor with low temperature co-fired ceramic core can be implemented in a low-current application merely. The inductor with ferrite core has two types. One type of the inductor has a winding disposed in a window of the magnetic core. Under this circumstance, assembly tolerance exists and the issue of space caused due to the R angle around the magnetic core for installing the winding is a waste of space. Consequently, the space utilization of the inductor is reduced.

Therefore, there is a need of providing a magnetic assembly and a power module using the same in order to overcome the drawbacks encountered by the prior art.

SUMMARY OF THE INVENTION

The present invention provides a magnetic assembly and a power module using the same. The magnetic assembly is optimized and integrated so that a power module with high efficiency and high powder density is achieved. The occupied space of the power module relative to the system motherboard can be decreased, so that the products with the power module are more competitive.

The present invention further provides a power module. The power module having the optimized magnetic assembly can be adjusted according the practical requirements, so as to increase the design flexibility, optimize the circuit characteristics of the power module and integrate more functions in the power module.

In accordance with an aspect of the present invention, there is provided a magnetic assembly. The magnetic assembly includes a first magnetic core, a second magnetic core and a first series winding. The first magnetic core has a first top surface, a first bottom surface, a first sidewall, a second sidewall, at least one first sidewall through-hole and at least one second sidewall through-hole. The at least one first sidewall through-hole is disposed along the first sidewall, and the at least one second sidewall through-hole is disposed along the second sidewall. The second magnetic core includes a second top surface and a second bottom surface. The second top surface or the second bottom surface of the second magnetic core is partially attached on the first top surface or the first bottom surface of the first magnetic core. The first series winding has a first upper winding set, a first lower winding set, a first sidewall winding set, and a second sidewall winding set. The first upper winding set is disposed on the first top surface. The first lower winding set is disposed on the first bottom surface. The first sidewall winding set is disposed on the first sidewall through-holes. The second sidewall winding set is disposed on the second sidewall through-holes. The upper winding set is electrically connected to the lower winding set via the first sidewall winding set, and the second sidewall winding set is further electrically connected to the lower winding set, so as to form the first series winding in series.

The present invention further provides a power module. The power module includes a magnetic assembly, a switching device, and a conductive circuit. The magnetic assembly includes at least a first magnetic core, a second magnetic core and a first series winding. The first magnetic core has a first top surface, a first bottom surface, a first sidewall, a second sidewall, at least one first sidewall through-hole and at least one second sidewall through-hole. The at least one first sidewall through-hole is disposed along the first sidewall, and the second sidewall through-hole is disposed along the second sidewall. The first series winding has a first upper winding set, a first lower winding set, a first sidewall winding set, and a second sidewall winding set. The second magnetic core has a second top surface and a second bottom surface. The second top surface or the second bottom surface of the second magnetic core is partially attached on the first top surface or the first bottom surface of the first magnetic core. The first upper winding set is disposed on the first top surface. The first lower winding set is disposed on the first bottom surface. The first sidewall winding set is disposed on the first sidewall through-holes. The second sidewall winding set is disposed on the second sidewall through-holes. The upper winding set is electrically connected to the lower winding set via the first sidewall winding set, and the second sidewall winding set is further electrically connected to the lower winding set, so as to form the first series winding around the first magnetic core. The switching device is disposed on the first top surface or the first bottom surface of the first magnetic core. The conductive circuit is disposed on the first top surface or the first bottom surface of the first magnetic core and electrically connected to the switching device.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
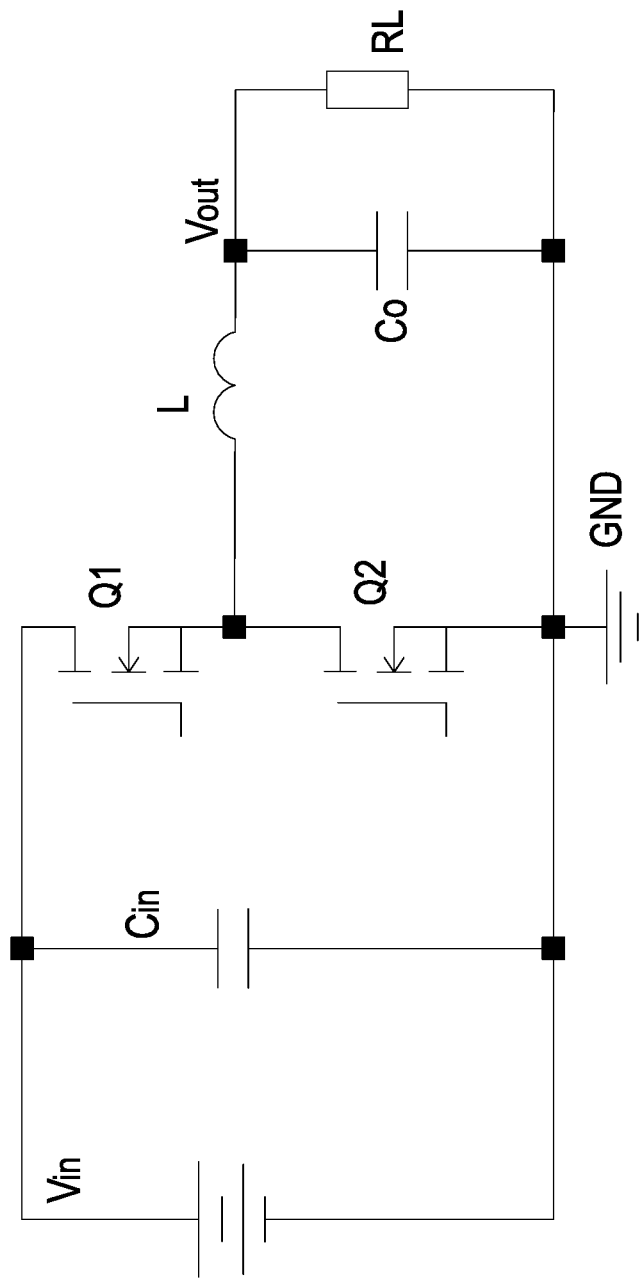
FIG. 1 shows a circuit diagram of a typical buck converter.
Figure 2A:
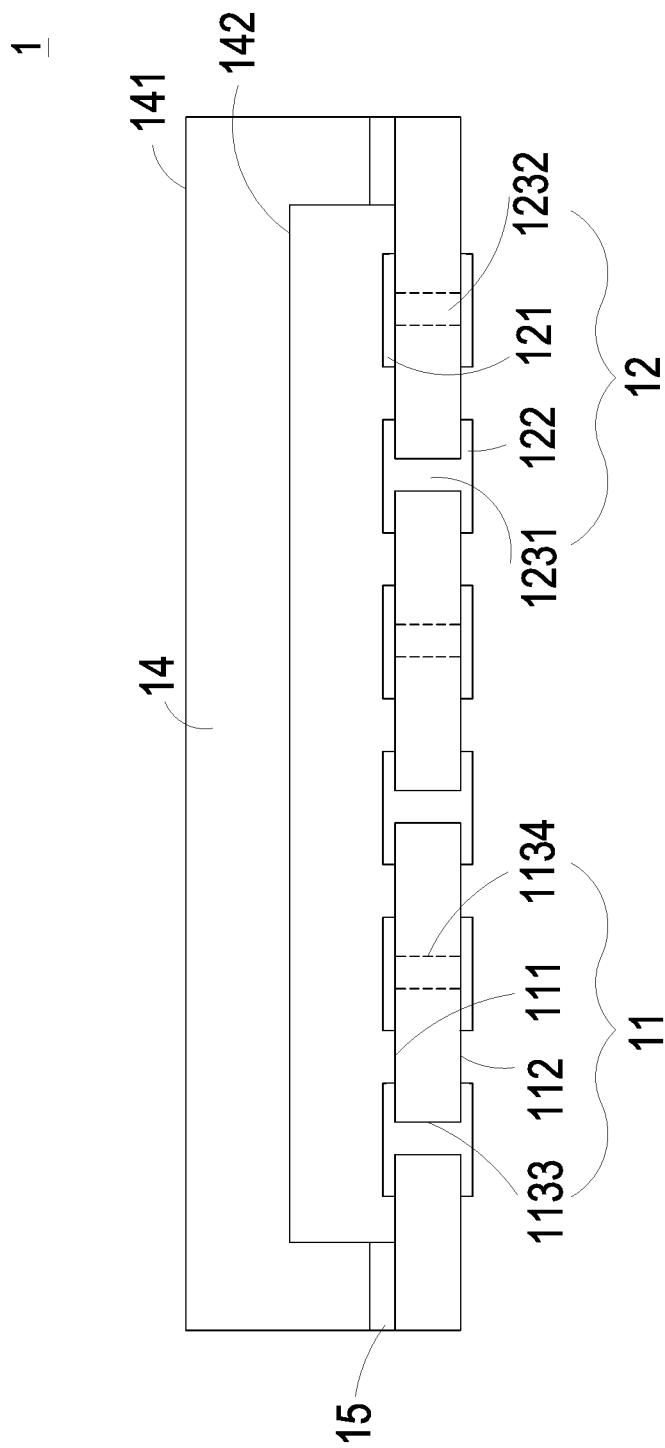
FIG. 2A is a schematic cross-sectional view illustrating a magnetic assembly according to a first embodiment of the present invention.
Figure 2B:
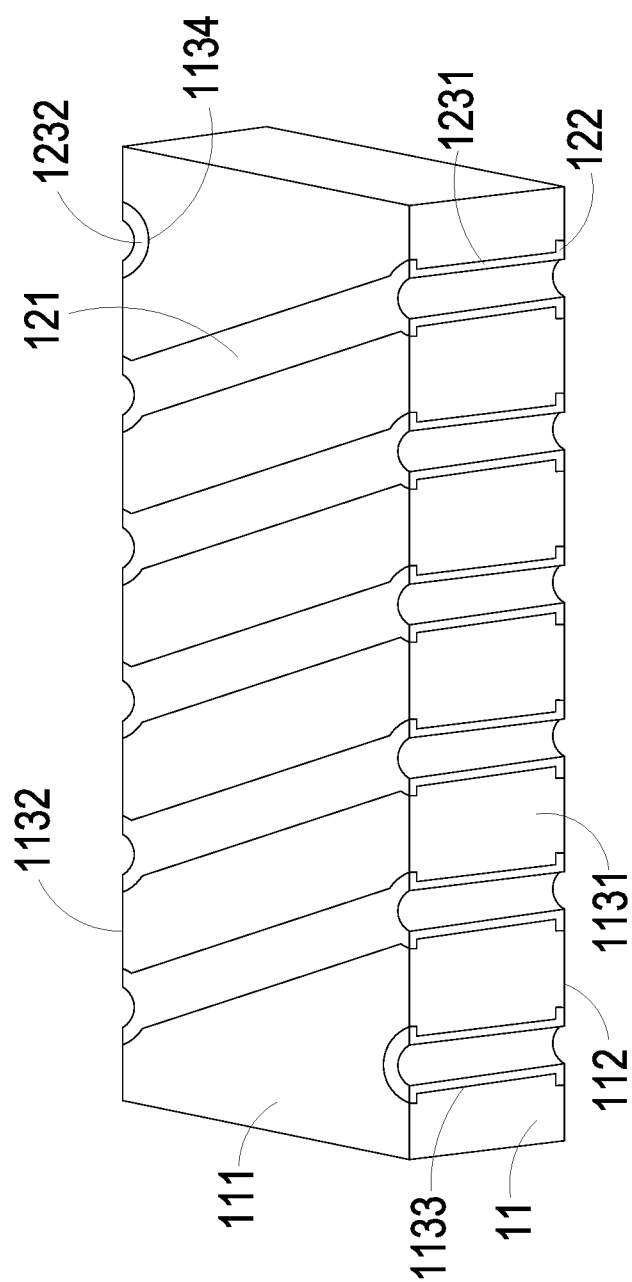
FIG. 2B is a perspective view illustrating the first magnetic core and the first series winding of the magnetic assembly of FIG. 2A.
Figure 2C:
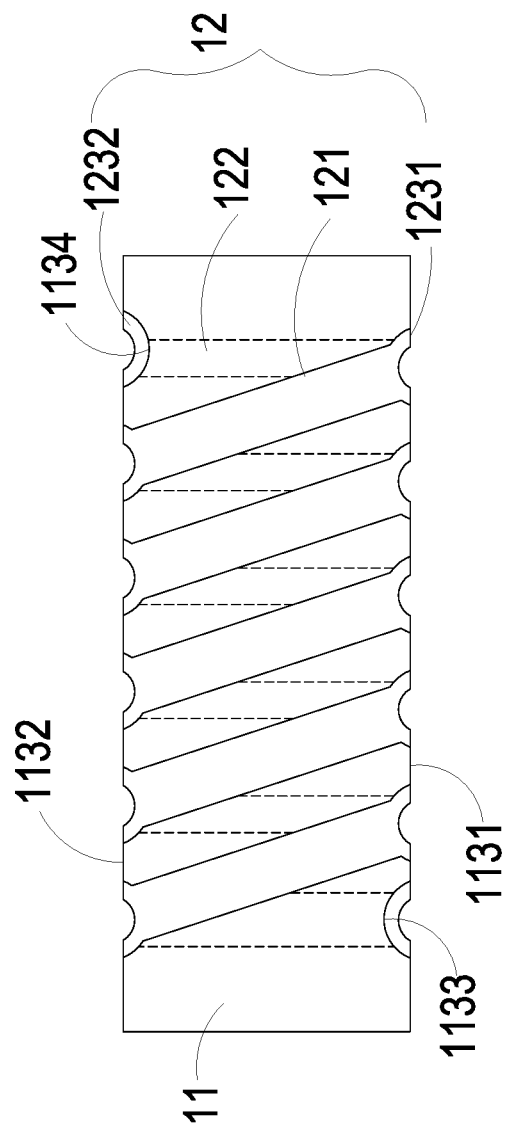
FIG. 2C is a top view illustrating the first magnetic core and the first series winding of the magnetic assembly of FIG. 2A.

FIG. 2A is a schematic cross-sectional view illustrating a magnetic assembly according to a first embodiment of the present invention. As shown in FIG. 2A, the magnetic assembly 1 includes a first magnetic core 11, a second magnetic core 14 and a first series winding 12. The first magnetic core 11 is an I-type magnetic core and the second magnetic core 14 is a U-type magnetic core. Alternatively, the second magnetic core 14 is an I-type or E-type magnetic core, and the first magnetic core 11 is a U-type magnetic core or E-type magnetic core, and it is not limited thereto. In the embodiment, the magnetic assembly 1 includes the first series winding 12 disposed on the first magnetic core 11. At least a portion of the second magnetic core 14 is attached on the first magnetic core 11 so as to form the magnetic assembly 1. FIG. 2B is a perspective view illustrating the first magnetic core and the first series winding of the magnetic assembly of FIG. 2A. FIG. 2C is a top view illustrating the first magnetic core and the first series winding of the magnetic assembly of FIG. 2A. As shown in FIGS. 2B and 2C, the first magnetic core 11 of the magnetic assembly 1 has a first top surface 111, a first bottom surface 112, a first sidewall 1131, a second sidewall 1132, at least a first sidewall through-hole 1133 and at least a second sidewall through-hole 1134. The first sidewall through-holes 1133 are disposed on the first sidewall 1131, and the second sidewall through-holes 1134 are disposed on the second sidewall 1132. The first sidewall 1131 and the second sidewall 1132 are opposite to each other. The first series winding 12 has a first upper winding set 121, a first lower winding set 122, a first sidewall winding set 1231, and a second sidewall winding set 1232. The first upper winding set 121 is disposed on the first top surface 111. The first lower winding set 122 is disposed on the first bottom surface 112. The first sidewall winding set 1231 is disposed in the first sidewall through-holes 1133. The second sidewall winding set 1232 is disposed in the second sidewall through-holes 1134. The upper winding set 121 is electrically connected to the lower winding set 122 via the first sidewall winding set 1231, and the second sidewall winding set 1232 is further electrically connected to the first lower winding set 122 and has a portion connected to other adjacent portion of the first upper winding set 121, so as to connect the first upper winding set 121, the first sidewall winding set 1231, the first lower winding set 122 and the second sidewall winding set 1232 in series and form the first series winding 12. The second magnetic core 14 has a second top surface 141 and a second bottom surface 142. The adhering method of the first magnetic core 11 and the second magnetic core 14 is not limited. The second bottom surface 142 of the second magnetic core 14 has at least a portion attached on the first top surface 111 of the first magnetic core 11. In the embodiment, the second bottom surface 142 of the second magnetic core 14 is partially attached on the first top surface 111 of the first magnetic core 11 via an adhesive material 15, as shown in FIG. 2A. The adhesive material 15 is constructed by a non-magnetic material with the relative magnetic permeability about 1 or a magnetic material with the relative magnetic permeability lager than 1, and it is not limited thereto. Alternatively, in other embodiment, the second magnetic core 14 is not limited to a U-type magnetic core, and the second magnetic core 14 can be an I-type or E-type magnetic core. In the above embodiment, the first series winding 12 has the first upper winding set 121, the first lower winding set 122, the first sidewall winding set 1231, and the second sidewall winding set 1232 connected in series with different wiring densities, so as to accomplish different numbers of winding turns on the first magnetic core 11. Alternatively, the first series winding 12 can have for example but not limited to the first upper winding set 121, the first sidewall winding set 1231 and the second sidewall winding set 1232 merely to form a single winding turn on the first magnetic core 11. In practical application, the first series winding 12 of the magnetic assembly 1 is further electrically connected with an external device or a substrate (not shown). The first series winding 12 have two conductive terminals respectively connected with a pad (not shown), and the first series winding 12 is further connected to the external device or the carrying substrate via the pad. Alternatively, the first upper winding set 121, the first lower winding set 122, the first sidewall winding set 1231 or the second sidewall winding set 1232 of the first series winding 12 is directly connected to the external device or the carrying substrate, and the connecting points are disposed on for example but not limited to a single surface. Alternatively, the first sidewall winding set 1231 or the second sidewall winding set 1232 has a portion disposed near the first top surface 111 or the first bottom surface 112 and directly connected to the external device. Preferably but not exclusively, the portion of the first sidewall winding set 1231 or the portion of the second sidewall winding set 1232 near the first top surface 111 or the first bottom surface 112 has a curve surface, so that larger connecting area is provided and specific space for connecting is saved.

The first magnetic core 11 and the second magnetic core 14 are formed by a ferrite, a magnetic gel, an iron powder, a low temperature co-fired ceramic or a metallic magnetic material, and the first magnetic core 11 and the second magnetic core 14 are not limited to be constructed by the same material. Namely, the first magnetic core 11 and the second magnetic core 14 can be constructed by suitable materials according to the requirements of the electric property. In addition, the first magnetic core 11 and the second magnetic core 14 are adhered to form the magnetic assembly 1 by the adhesive material 15. The property, such as the inductance value, of the magnetic assembly 1 is adjustable by means of adjusting the thickness of the adhesive material 15, so as to create more variety of the design modification.

Figure 2D:
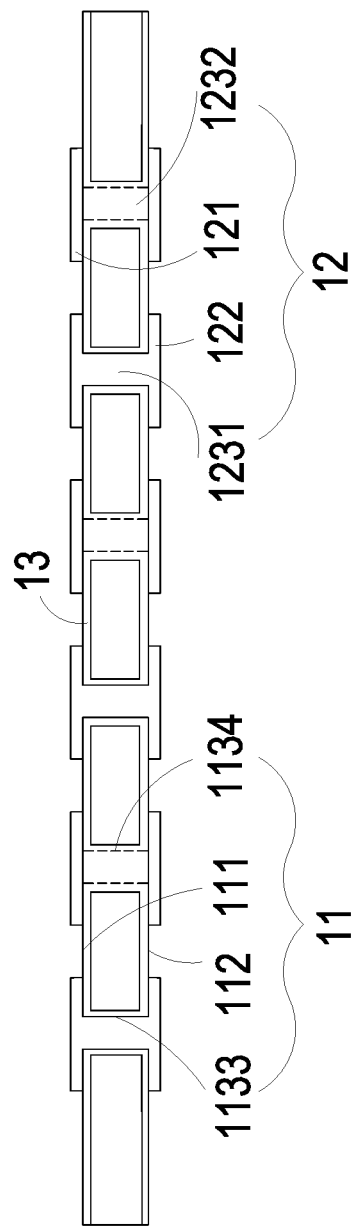
FIG. 2D is a cross-sectional view illustrating the first magnetic core and the first series winding of the magnetic assembly according to another embodiment.

In some embodiment, for enhancing the electric insulation of the first magnetic core 11 and the second magnetic core 14 or improving the withstanding voltage between the first magnetic core 11 and the first series winding 12, an insulating layer can be formed and cover on the first top surface 111, the first bottom surface 112, the at least one first sidewall through-hole 1133 and the at least one second sidewall through-hole 1134 of the first magnetic core 11 and the second top surface 141 and the second bottom surface 142 of the second magnetic core 14. FIG. 2D is a cross-sectional view illustrating the first magnetic core and the first series winding of the magnetic assembly according to another embodiment. In the embodiment, the first magnetic core 11 further includes an insulating layer 13 disposed on the first top surface 111, the first bottom surface 112, the surface of the at least one first sidewall through-hole 1133 and the surface of the at least one second sidewall through-hole 1134, so as to insulate the first magnetic core 11 from the first series winding 12. The insulating layer 13 can be formed by a method including for example but not limited to lamination, printing, immersion, spraying or vapor deposition. The insulating layer 13 disposed on the surface of the first sidewall through-holes 1133 and the surface of the second sidewall through-holes 1134 can be formed by the above method, or formed by means of drilling or cutting after the insulating material is filled in the via holes, and it is not limited thereto. Similarly, the second magnetic core 14 have an insulating layer the same as that of the first magnetic core 11, and it is not redundantly described herein.

Figure 3A:
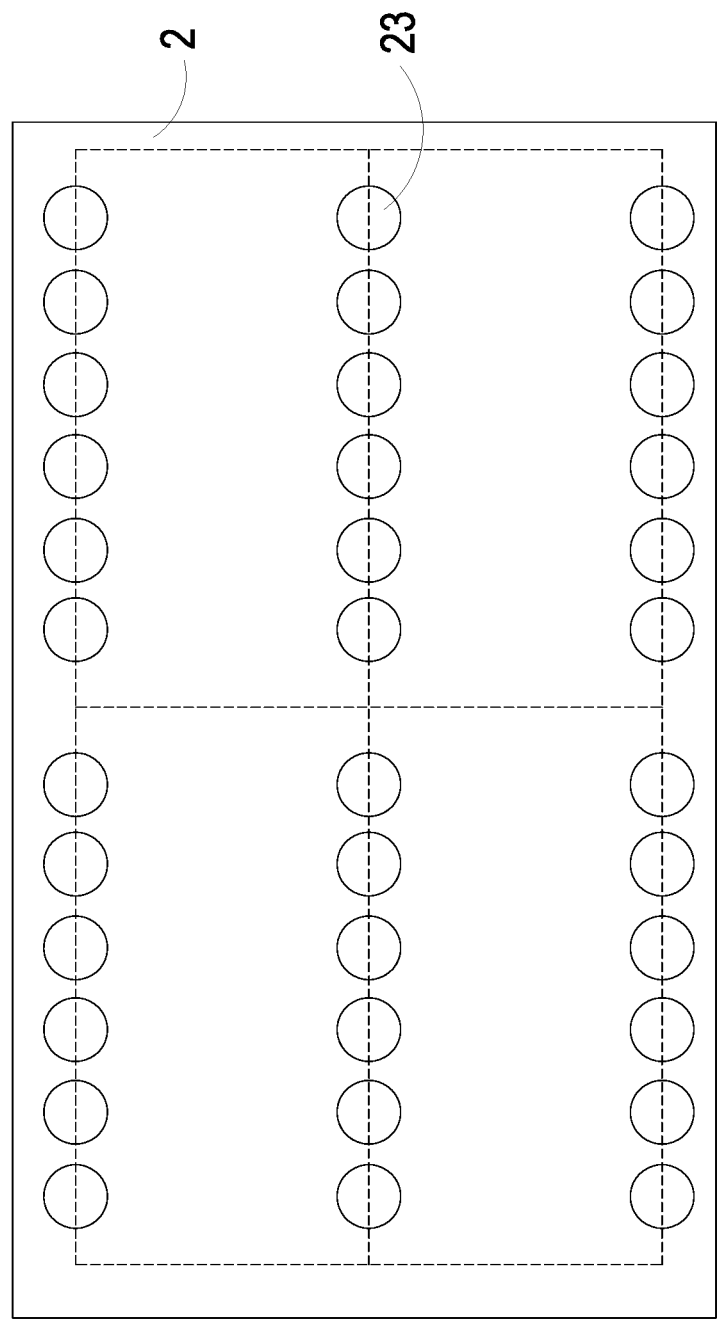
FIGS. 3A to 3C schematically illustrate the structure of the magnetic assembly in different steps according to a manufacturing process of the present invention.
Figure 3B:
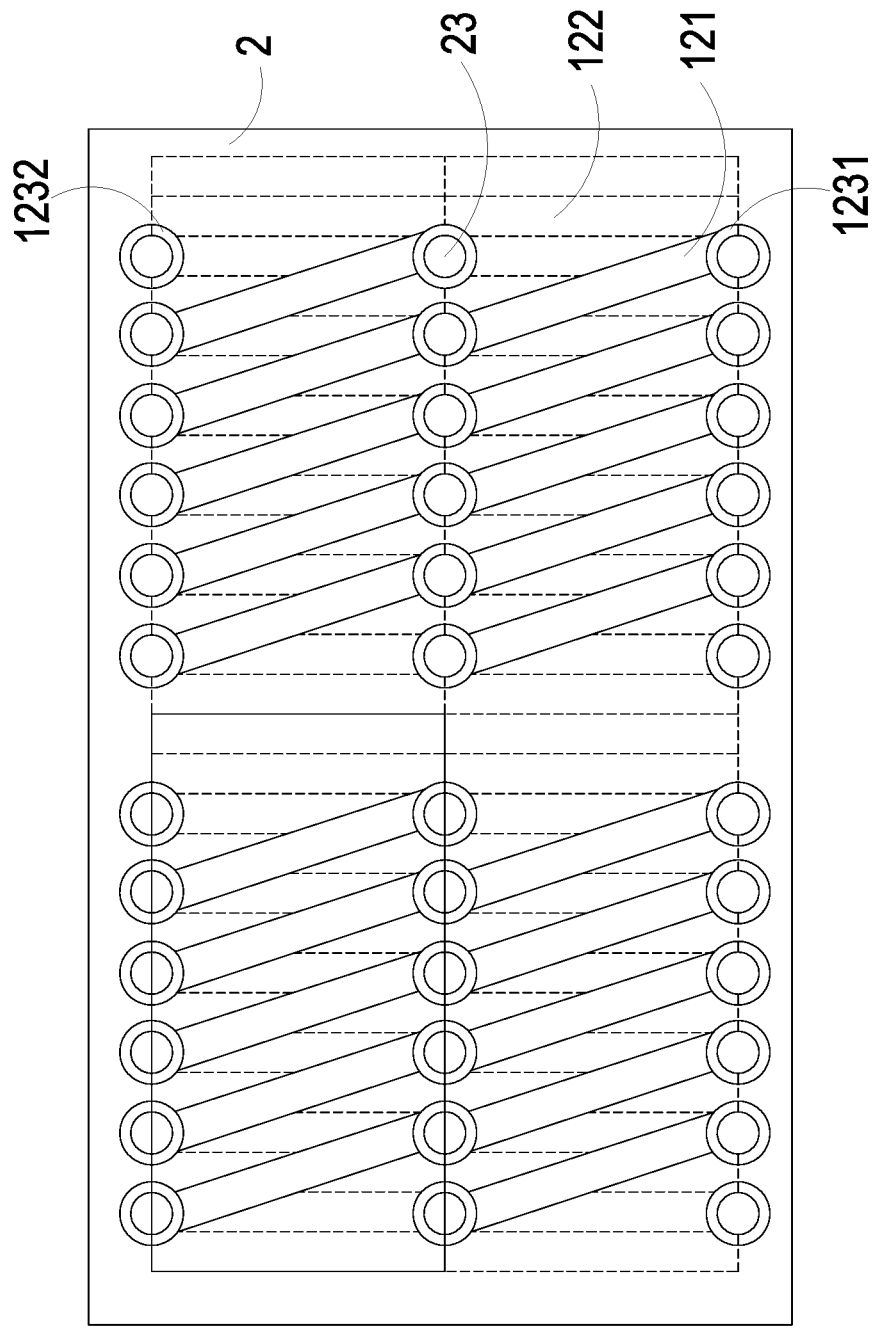
Figure 3C:
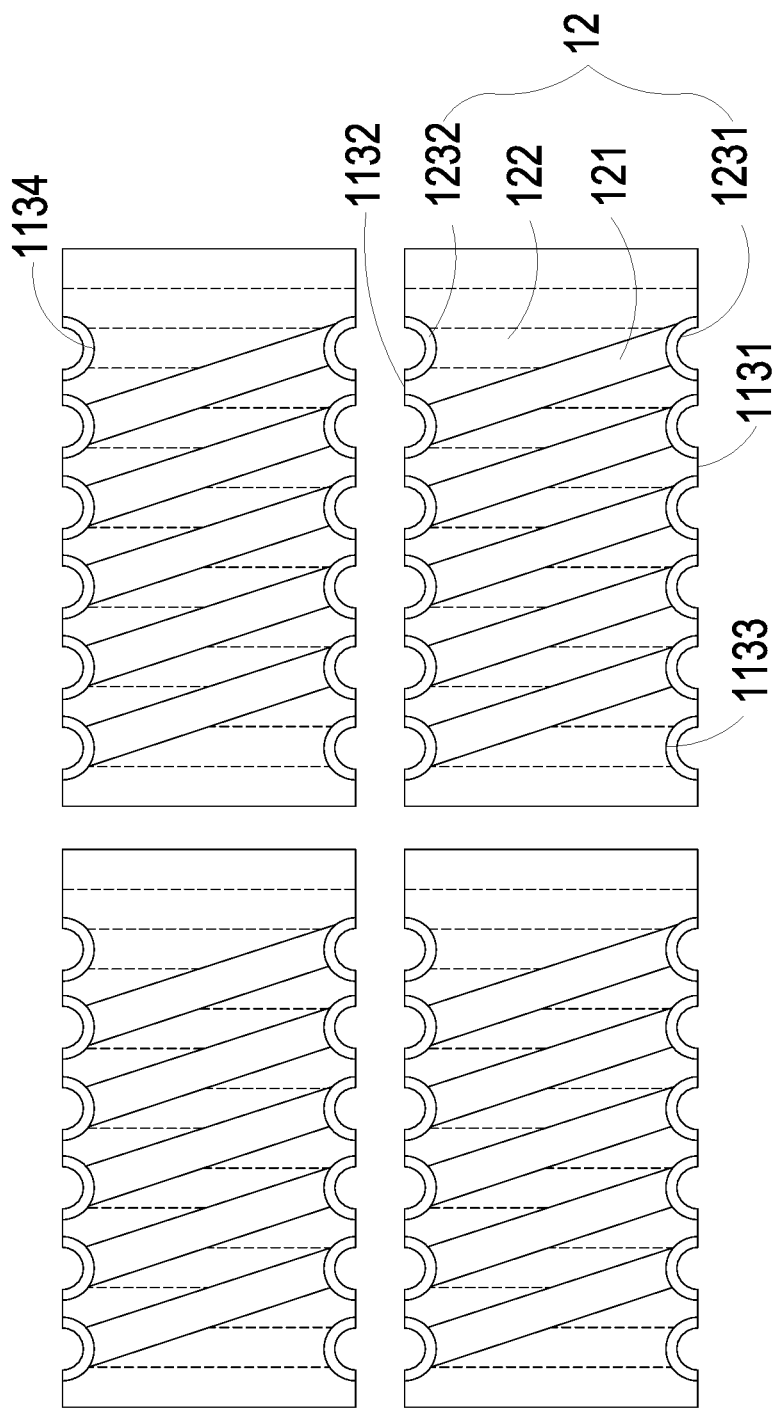

In the above embodiments, the first series winding 12 is a metalized layer disposed on the first magnetic core 11. In some embodiments, the magnetic assembly 1 having the first series winding 12 and the first magnetic core 11 can go into mass production by a panel manufacturing process. FIGS. 3A to 3C schematically illustrate the structure of the magnetic assembly in different steps according to a manufacturing process of the present invention. Firstly, a magnetic substrate 2 having a larger area is provided. The size of the magnetic substrate 2 is much larger than that of the first magnetic core 11 of the magnetic assembly 1. In the embodiment, the magnetic substrate 2 can be divided into four (i.e. 2×2=4) first magnetic core 11 of the magnetic assemblies 1. Namely, each first magnetic core 11 of the magnetic assembly 1 has an area equal to a closed area defined by the dotted line frame shown in FIG. 3A. Then, at least one through hole 23 is formed on the positions corresponding to the at least one first sidewall through-hole 1133 and the at least one second sidewall through-hole 1134 by physical or chemical forming methods including for example but not limited to mechanical drilling, laser drilling, sandblasting drilling, waterjet drilling, chemical etching or plasma etching. Then, an upper conductive metal layer and a lower conductive metal layer (not shown) are formed on the top surface and the bottom surface of the magnetic substrate 2 and a through hole metal layer is formed in the at least one through hole 23 by means of for example but not limited to chemical plating or sputtering. In the embodiment, the upper conductive metal layer, the lower conductive metal layer and the through hole metal layer are formed by a single material or a single layer, but it is not limited thereto. Alternatively, all of them can be constructed as a multilayer structure according to the different functional requirements so as to increase the bonding force or prohibit the interaction between adjacent materials. Then, at least one conductive through hole (not shown) is formed in the at least one through hole 23 and the thicknesses of the upper conductive metal layer and the lower conductive metal layer are increased at the same time by for example but not limited to a copper plating process. In the embodiment, the conductive through holes, the upper conductive metal layer and the lower conductive metal layer have the thicknesses ranged from 5 µm to 300 µm and provide excellent electrically conducting/thermally conducting properties. Afterward, a lithography and etching process is performed to selectively etch the upper conductive metal layer and the lower conductive metal layer through a protecting photoresist so as to define the required patterns of the first upper winding set 121 and the first lower winding set 122, as shown in FIG. 3B. Finally as shown in FIG. 3C, four first magnetic cores 11 are obtained after cutting along the dotted line. Each first magnetic core 11 has an independent first series winding 12, and each first series winding 12 includes a first upper winding set 121, a first lower winding set 122, a first sidewall winding set 1231 and a second sidewall winding set 1232. The first upper winding set 121 and the first lower winding set 122 are connected with each other by the first sidewall winding set 1231, and the second sidewall winding set 1232 is connected to the first lower winding set 122, so that the first upper winding set 121, the first lower winding set 122, the first sidewall winding set 1231 and the second sidewall winding set 1232 are constructed on the first magnetic core 11 in series. In the embodiment, the first sidewall winding set 1231 is formed along the first sidewall 1131 of the first magnetic core 11 and the second sidewall winding set 1232 is formed along the second sidewall 1132 of the first magnetic core 11 by means of cutting the magnetic substrate 2 along the through holes 23, so that the mass production is simplified and a waste of space of the magnetic assembly is avoided. It is noted that the first sidewall through-holes 1133 disposed on the first sidewall 1131 and the second sidewall through-holes 1134 disposed on the second sidewall 1132 are not limited to symmetrical through holes having uniform radii as shown in FIGS. 3A to 3C. In some embodiments, the first sidewall through-holes 1133 and the second sidewall through-holes 1134 are non-symmetrical through holes having different radius. After cutting the magnetic substrate 2 by a cutter having a specific blade thickness, the first sidewall 1131 and the second sidewall 1132 are formed and the first sidewall through-holes 1133 and the second sidewall through-holes 1134 are exposed and obtained. According to the above manufacturing process, if at least one entire through hole instead of sidewall through-holes are formed in the magnetic core and a winding is formed and connected by the entire through holes passing through the magnetic core, the through holes will cause a waste of space of the magnetic core for obtaining the same inductance at the same plane size. In addition, the magnetic assembly 1 of the present invention has the first magnetic core 11 and the second magnetic core 14 integrated together. For obtaining the same inductance at the same plane size, one magnetic core has a thickness twice as thick as that of each one of the two magnetic cores. If the magnetic assembly is constructed by a single magnetic core merely, it will be more difficult to drill the single magnetic core and the electroplating process will be limited by the depth of the through holes. If single magnetic core is utilized, the diameters of the through holes disposed in the magnetic core are increased obviously and a waste of space is caused.

In the embodiment, after the first series winding 12 is formed on each first magnetic core 11, the cutting process is performed directly and then each second magnetic core 14 is attached on the corresponding first magnetic core 11 so as to obtain the plural magnetic assemblies 1. In other embodiment, plural second magnetic cores 14 are adhered on the corresponding first magnetic cores 11 constructed with the first series winding 12 firstly. After assembling together, plural independent magnetic assemblies 1 are separated and obtained by cutting.

Figure 4A:
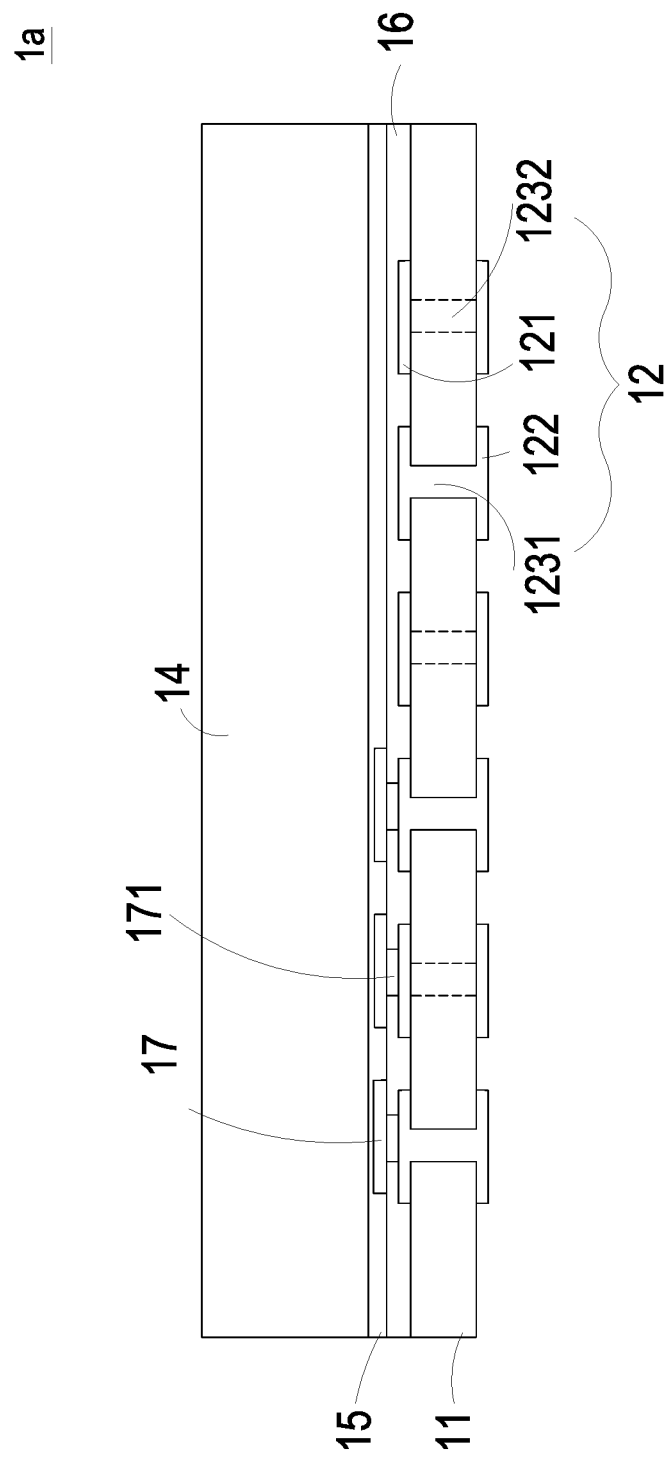
FIG. 4A is a schematic cross-sectional view illustrating a magnetic assembly according to a second embodiment of the present invention.
Figure 4B:
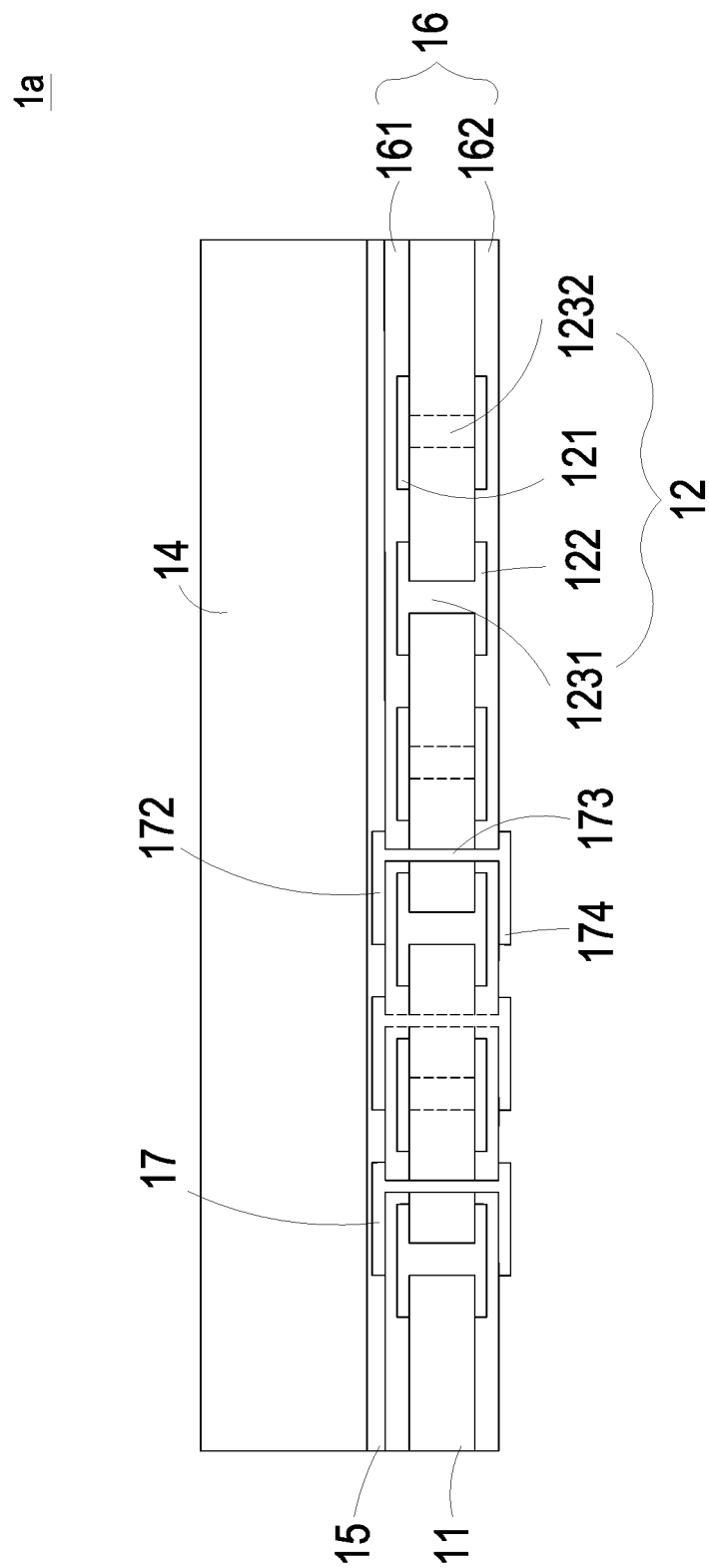
FIG. 4B is a schematic cross-sectional view illustrating a magnetic assembly according to other embodiment.

FIG. 4A is a schematic cross-sectional view illustrating a magnetic assembly according to a second embodiment of the present invention. In the embodiment, the structures, elements and functions of the magnetic assembly 1a are similar to those of the magnetic assembly 1 in FIG. 2A, and are not redundantly described herein. Comparing with the embodiment of FIG. 2A, the magnetic assembly 1a further includes an insulating dielectric layer 16 and an additional winding 17. The second magnetic core 14 is adhered on the first magnetic core 11 via an adhesive material 15 disposed on the insulating dielectric layer 16 and the additional winding 17. The insulating dielectric layer 16 is disposed on the first series winding 12. The additional winding 17 is disposed on the insulating dielectric layer 16 and electrically connected to the first upper winding set 121, so that the additional winding 17 is electrically connected with the first series winding 12 in parallel or series. As shown in FIG. 4A, the insulating dielectric layer 16 has at least a portion disposed on the first top surface 111 of the first magnetic core 11 and covering the first upper winding set 121 of the first series winding 12. The additional winding 17 has at least a portion disposed on the insulating dielectric layer 16 and electrically connected to the first series winding 12 in parallel via a conductive via 171. Alternatively, in other embodiment, as shown in FIG. 4B, the insulating dielectric layer 16 further includes an upper insulating dielectric layer 161 and a lower insulating dielectric layer 162. The upper insulating dielectric layer 161 and the lower insulating dielectric layer 162 have at least a portion disposed on the first top surface 111 and the first bottom surface 112 of the first magnetic core 11 and covering the first upper winding set 121 and the first lower winding set 122 of the first series winding 12, respectively. The additional winding 17 includes an upper additional winding set 172 and a lower additional winding set 174. The upper additional winding set 172 and the lower additional winding set 174 have a portion disposed on the upper insulating dielectric layer 161 and the lower insulating dielectric layer 162 of the insulating dielectric layer 16, respectively. The additional winding 17 further includes a connecting part 173 electrically connected between the upper additional winding set 172 and the lower additional winding set 174 so as to form the additional winding 17 connected with the first series winding 12 in series. In the embodiment, preferably but not exclusively, the connecting part 173 can be a via or a sidewall through-hole of the first magnetic core 11. In the practical application, the lower additional winding set 174 can be disposed on the first bottom surface 112 of the first magnetic core 11 directly and insulated from the first lower winding set 122. Alternatively, the connecting part 173 can be disposed on the first sidewall 1131 and the second sidewall 1132 of the first magnetic core 11 and insulated from the first sidewall winding set 1231 and the second sidewall winding set 1232. In some embodiments, the first bottom surface 112 of the first magnetic core 11 has a smaller area, and the first lower winding set 122 of the first series winding 12 and the lower additional winding sea 174 of the additional winding 17 can be formed by metal fine wires disposed on the first bottom surface 112 of the first magnetic core 11. Similarly, the connecting part 173, the first sidewall winding set 1231 and the second sidewall winding set 1232 can be formed in the same way, and it is not redundantly described herein. When the additional winding 17 and the first series winding 12 are electrically connected in parallel, the current capacity of the magnetic assembly 1a will be enhanced so as to decrease the winding loss. When the additional winding 17 and the first series winding 12 are electrically connected in series, the winding turns of the magnetic assembly 1a will be increased. In other embodiments, the additional winding 17 and the first series winding 12 can be electrically connected in hybrid serial-parallel connection according to the design, and it is not limited thereto.

Figure 5:
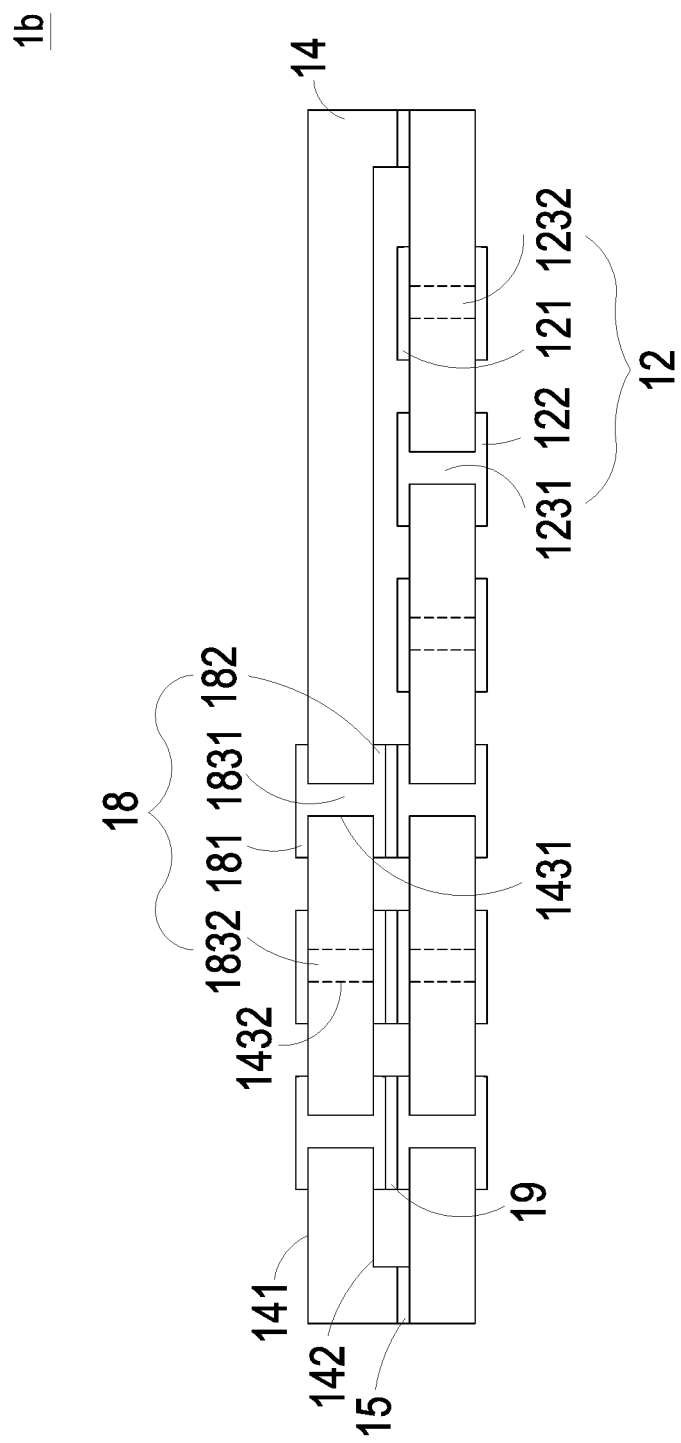
FIG. 5 is a schematic cross-sectional view illustrating a magnetic assembly according to a third embodiment of the present invention.

FIG. 5 is a schematic cross-sectional view illustrating a magnetic assembly according to a third embodiment of the present invention. In the embodiment, the structures, elements and functions of the magnetic assembly 1b are similar to those of the magnetic assembly 1 in FIG. 2A, and are not redundantly described herein. Comparing with the magnetic assembly 1 of FIG. 2A, the magnetic assembly 1b further includes a second series winding 18 disposed on the second magnetic core 14. The second series winding 18 includes a second upper winding set 181, a second lower winding set 182, a third sidewall winding set 1831 and a fourth sidewall winding set 1832. The second upper winding set 181 is disposed on the second top surface 141 of the second magnetic core 14. The second lower winding set 182 is disposed on the second bottom surface 142 of the second magnetic core 14. The third sidewall winding set 1831 is disposed in the third sidewall through-hole 1431 of the second magnetic core 14. The fourth sidewall winding set 1832 is disposed in the fourth sidewall through-hole 1432 of the second magnetic core 14. The second upper winding set 181 is connected to the second lower winding set 182 via the third sidewall winding set 1831, and the fourth sidewall winding set 1832 is connected to the second lower winding set 182, so as to form the second series winding 18 in series. The second series winding 18 of the second magnetic core 14 is electrically connected to the first series winding 12 of the first magnetic core 11 via a conductive material 19. When the second series winding 18 and the first series winding 12 are electrically connected in parallel, the current capacity of the magnetic assembly 1b will be enhanced so as to decrease the winding loss. When the second winding 18 and the first series winding 12 are electrically connected in series, the winding turns of the magnetic assembly 1b will be increased. Alternatively, the second series winding 18 and the first series winding 12 can be electrically connected in hybrid serial-parallel connection according to the design, and it is not limited thereto. In the embodiment, the second magnetic core 14 is adhered on the first magnetic core 11 via an adhesive material 15. Similar to the first magnetic core 11 shown in FIG. 2D, an insulating layer is disposed on the first top surface 111, the first bottom surface 112, the surface of the at least one first sidewall through-hole 1133 and the surface of the at least one second sidewall through-hole 1134 of the first magnetic core 11, and the insulating layer is disposed on the second top surface 141, the second bottom surface 142, the third sidewall through-hole 1431 and the fourth sidewall through-hole 1432 of the second magnetic core 14 for insulating the second magnetic core 14 from the second series winding 18. Alternatively, similar to the insulating dielectric layer 16 shown in FIG. 4A, an insulating dielectric layer is disposed on the first series winding 12. In addition, the additional winding 17 is disposed on the insulating dielectric layer 16 and electrically connected to the first upper winding set 121, so that the additional winding 17 is electrically connected with the first series winding 12 in parallel or series. In other embodiment, an insulating dielectric layer can be further disposed on the second series winding 18, and an additional winding can be disposed on the insulating dielectric layer and electrically connected to the second upper winding set 181 for connecting the additional winding with the second series winding in parallel or series.

Figure 6:
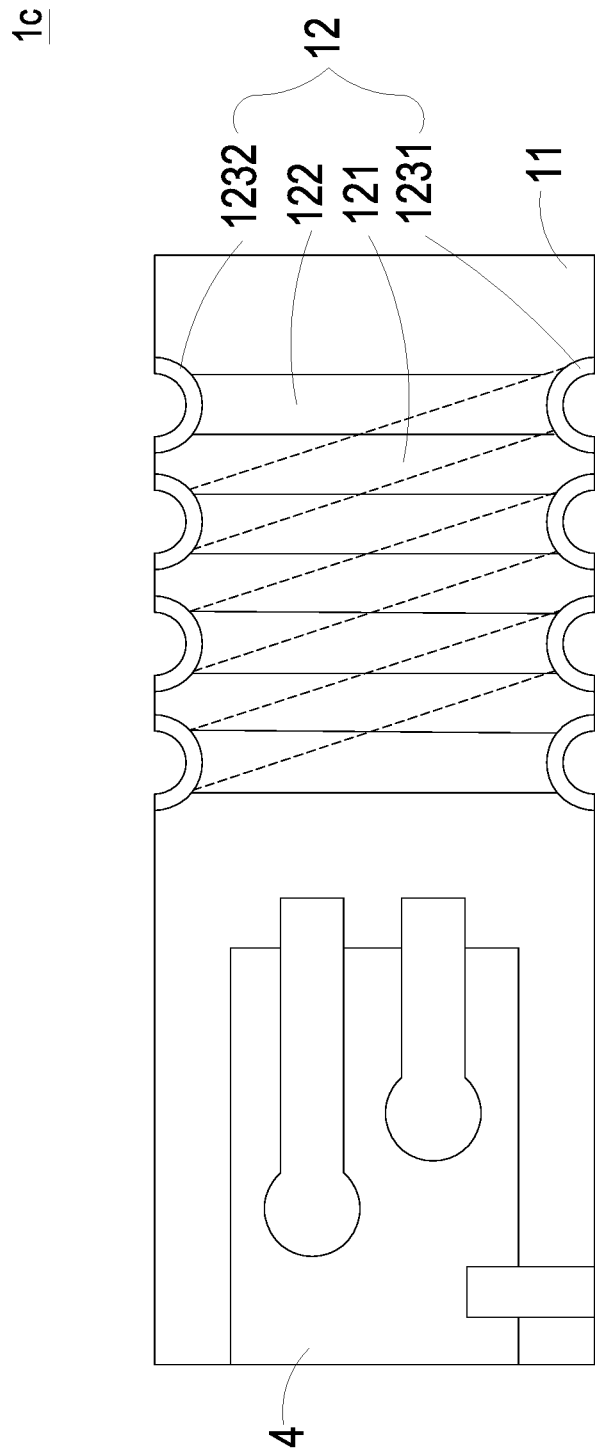
FIG. 6 is a schematic bottom view illustrating a magnetic assembly according to a fourth embodiment of the present invention.

In the above embodiments, the first magnetic core 11 or the second magnetic core 14 of the magnetic assembly 1 is utilized as a substrate, so that other structural supporting element needn't to be employed and a waste of space will be avoided. On the other hand, for preventing from the issue of magnetic interference, the first magnetic core 11 and the second magnetic core 14 include respective integral shielding layers for protecting. Alternatively, a non-magnetic zone can be formed in the first magnetic core 11 and the second magnetic core 14. FIG. 6 is a schematic bottom view illustrating a magnetic assembly according to a fourth embodiment of the present invention. In the embodiment, the structures, elements and functions of the magnetic assembly 1c are similar to those of the magnetic assembly 1 in FIG. 2A, and are not redundantly described herein. Comparing with the magnetic assembly 1 of FIG. 2A, the magnetic assembly 1c further includes a non-magnetic zone 4. A through hollow section is formed in the first magnetic core 11, and filled with a non-magnetic and insulating material so as to form the non-magnetic zone 4. Similarly, the non-magnetic zone 4 can have a circuit or a via, so as to carry magnetic-sensitive switching devices, circuits or other devices thereon.

Figure 7:
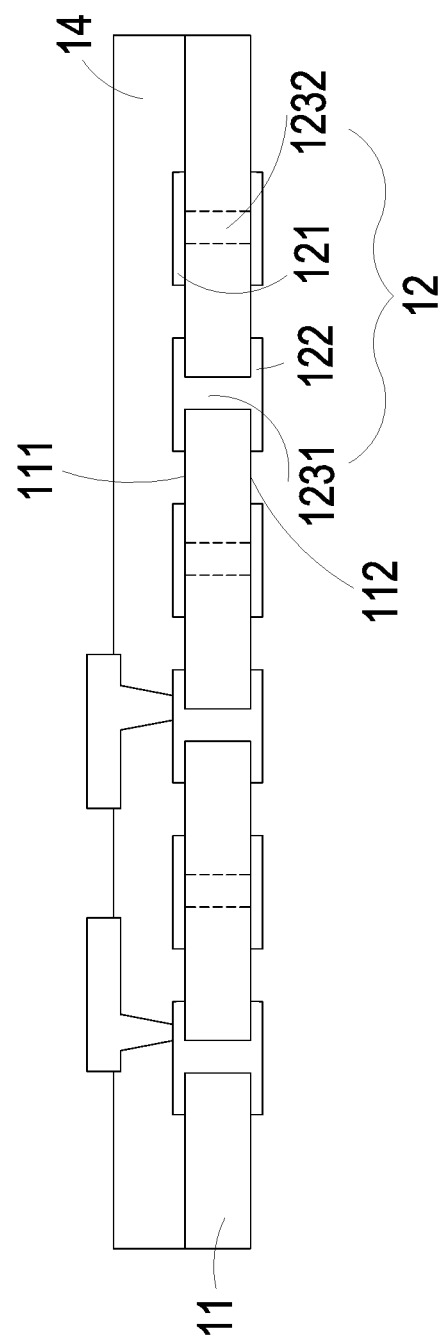
FIG. 7 is a schematic cross-sectional view illustrating a magnetic assembly according to a fifth embodiment of the present invention.

On the other hand, the second magnetic core 14 can have a constructing material different from that of the first magnetic core 11. FIG. 7 is a schematic cross-sectional view illustrating a magnetic assembly according to a fifth embodiment of the present invention. In the embodiment, the structures, elements and functions of the magnetic assembly 1d are similar to those of the magnetic assembly 1a in FIG. 4, and are not redundantly described herein. Different from the magnetic assemble 1a of FIG. 4, the second magnetic core 14 is constructed by a magnetic gel. The magnetic gel can be formed by for example but not limited to a printing method and disposed on the first top surface 111 of the first magnetic core 11 having the first series winding 12 constructed thereon. The magnetic gel can be formed by means of mixing magnetic materials into an organic matrix and have a good formability and magnetic property. The magnetic gel is solidified by means of heating. In some embodiments, the second magnetic core 14 constructed by the magnetic gel further includes more series windings or other functional circuits and it is not redundantly described herein.

Figure 8:
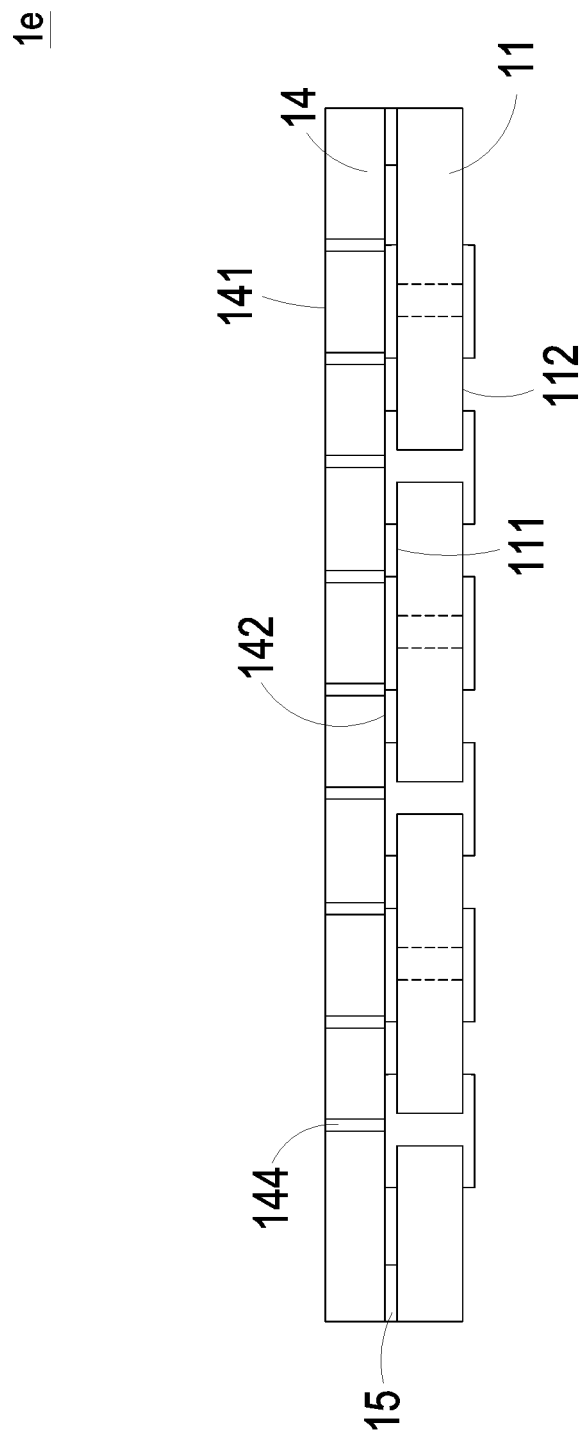
FIG. 8 is a schematic cross-sectional view illustrating a magnetic assembly according to a sixth embodiment of the present invention.

FIG. 8 is a schematic cross-sectional view illustrating a magnetic assembly according to a sixth embodiment of the present invention. In the embodiment, the structures, elements and functions of the magnetic assembly 1d are similar to those of the magnetic assembly 1a in FIG. 4, and are not redundantly described herein. Different from the magnetic assemble 1a of FIG. 4, the second magnetic core 14 of the magnetic assembly 1e further includes plural air gaps 144. The magnetic assembly 1e is constructed by the first magnetic core 11 and the second magnetic core 14. The first magnetic core 11 of the magnetic assembly 1e is similar to that of the above embodiments. Alternatively, the first magnetic core 11 has plural air gaps 144. In the embodiment, the plural air gaps 144 of the first magnetic core 11 and/or the second magnetic core 14 are utilized to adjust the magnetic properties of the magnetic assembly.

Figure 9:
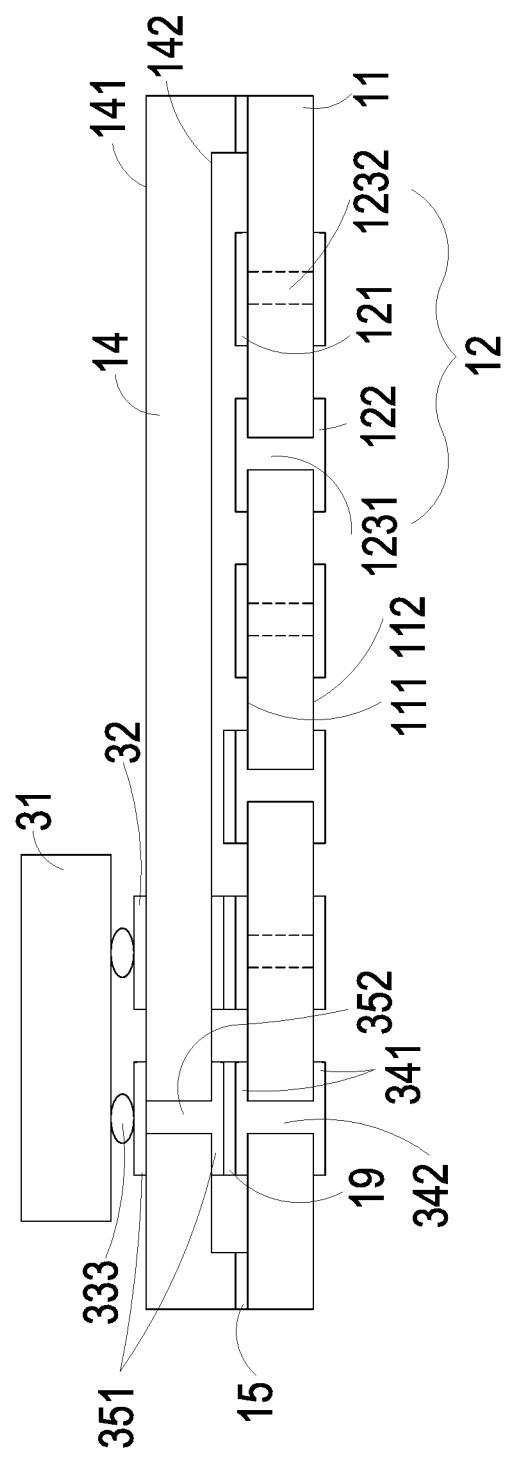
FIG. 9 is a schematic cross-sectional view illustrating a magnetic assembly according to a seventh embodiment of the present invention.

The magnetic assemblies described in the above embodiments can be implemented in a power module. FIG. 9 is a schematic cross-sectional view illustrating a magnetic assembly according to a seventh embodiment of the present invention. In the embodiment, the magnetic assembly 5 further includes an electronic component 31 and a conductive circuit 32. The electronic component 31 is disposed on the second top surface 141 of the second magnetic core 14 and electrically connected to the conductive circuit disposed on the second top surface 141 of the second magnetic core 14. In the embodiment, the electronic component 31 can be assembled as a flip chip on the conductive circuit 32 via a connecting element 333, but it is not limited thereto. The conductive circuit 32 is a metal wire disposed on the second top surface 141 of the second magnetic core 14. Alternatively, the conductive circuit 32 further includes a second connecting wire 351 and a second connecting via 352. The second connecting wire 351 is disposed on the second top surface 141 and the second bottom surface 142 of the second magnetic core 14 and electrically connected with each other via the second connecting via 352 of the second magnetic core 14. In the embodiment, the conductive circuit 32 further includes first connecting wires 341 and first connecting vias 342. The first connecting wires 341 are disposed on the first top surface 111 and the first bottom surface 112 of the first magnetic core 11 and connected with each other via the first connecting via 342. In some embodiment, the second connecting wire 351 and the second connecting via 352 can be constructed by a part of the second series winding 18, and the first connecting wire 341 and the first connecting via 342 can be constructed by a part of the first series winding 12. The first connecting wire 341 is electrically connected to the second connecting wire 351 via a conductive material 19. Consequently, the electronic component 31 is integrated in the magnetic assembly 5. In the embodiment, the electronic component 31 is disposed on the second top surface 141 of the second magnetic core 14. In other embodiments, the electronic component 31 can be disposed on the second bottom surface 142 of the second magnetic core 14, the first top surface 111 of the first magnetic core 11 or the first bottom surface 112 of the first magnetic core 11. In the embodiment, the electronic component 31 is integrated with the first magnetic core 11 and the second magnetic core 14 of the magnetic assembly, so that the occupied space of the power module relative to the system motherboard can be decreased and the products with the power module will be more competitive.

Figure 10:
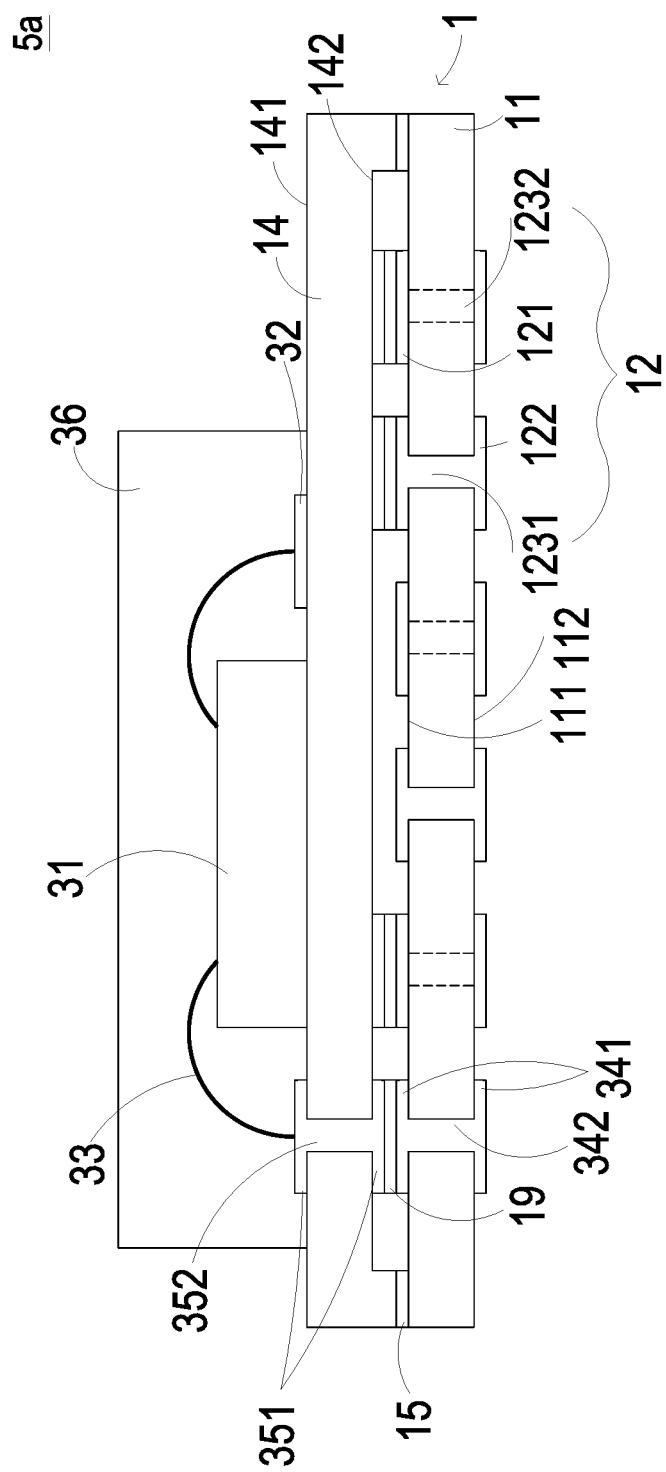
FIG. 10 is a schematic cross-sectional view illustrating a magnetic assembly according to an eighth embodiment of the present invention.

FIG. 10 is a schematic cross-sectional view illustrating a magnetic assembly according to an eighth embodiment of the present invention. In the embodiment, the structures, elements and functions of the magnetic assembly 5a are similar to those of the magnetic assembly 5 in FIG. 9, and are not redundantly described herein. Different from the magnetic assemble 5 of FIG. 9, the magnetic assembly 5a further includes an insulating and packaging layer 36 covering the electronic component 31 and the conductive circuit 32. The electronic component 31 is disposed on the second top surface 141 of the second magnetic core 14 and electrically connected to the conductive circuit 32 disposed on the second top surface 141 of the second magnetic core 14 via for example but not limited to a bonding wire 33. In the embodiment, the second magnetic core 14 has structural strength, low thermal expansion coefficient, and constructing materials similar to that of electronic component 31 constructed by the silicon, so that the electronic component 31, the bonding wire 33 and the conductive circuit 32 can be integrated on the second magnetic core 14 for improving the power density of the power module.

Figure 11:
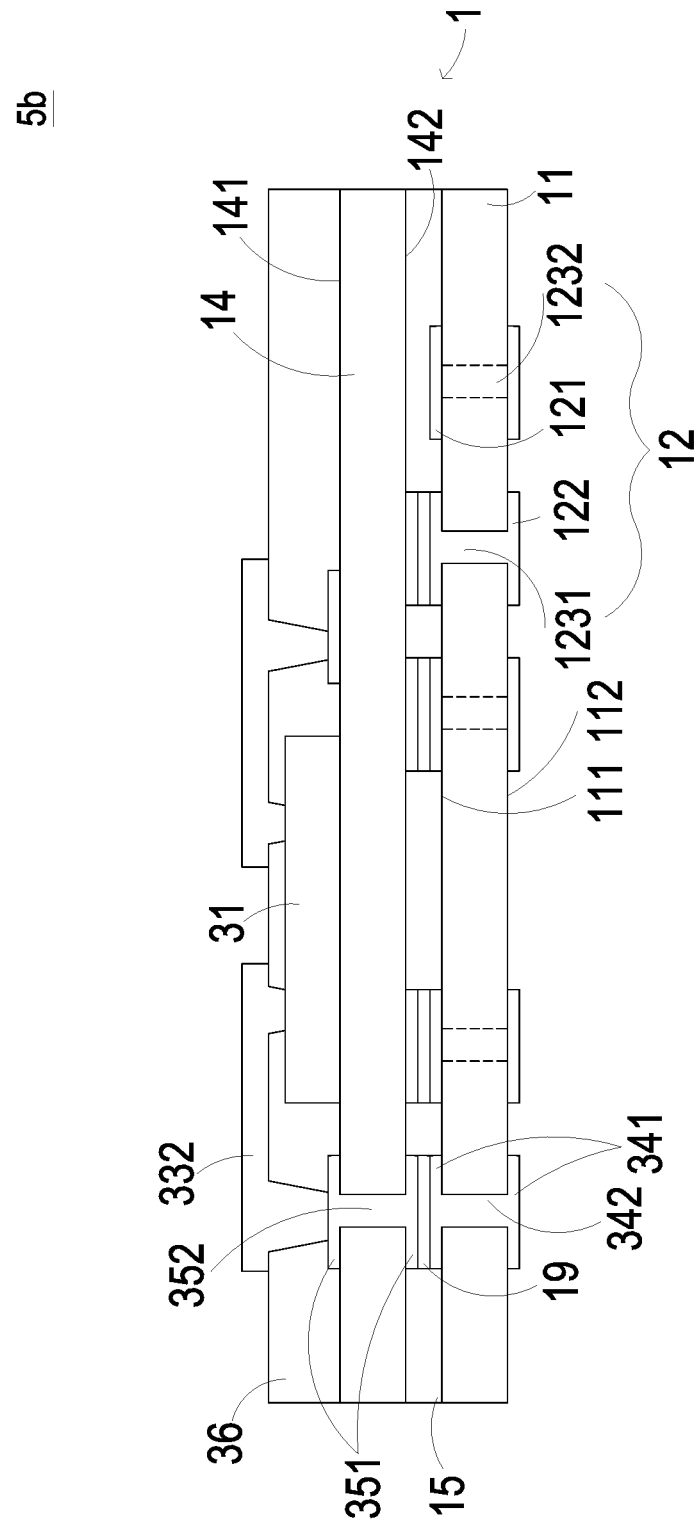
FIG. 11 is a schematic cross-sectional view illustrating a magnetic assembly according to a ninth embodiment of the present invention.
Figure 12A:
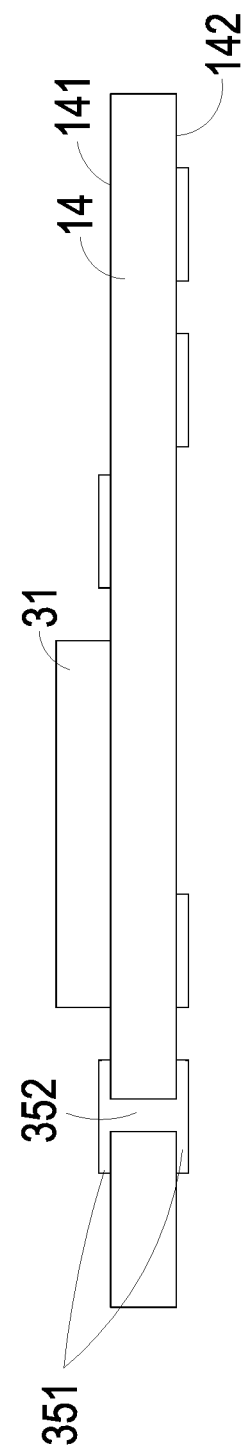
FIGS. 12A to 12D schematically illustrate the structure of the magnetic assembly of FIG. 11 in different steps according to a manufacturing process of the present invention.
Figure 12B:
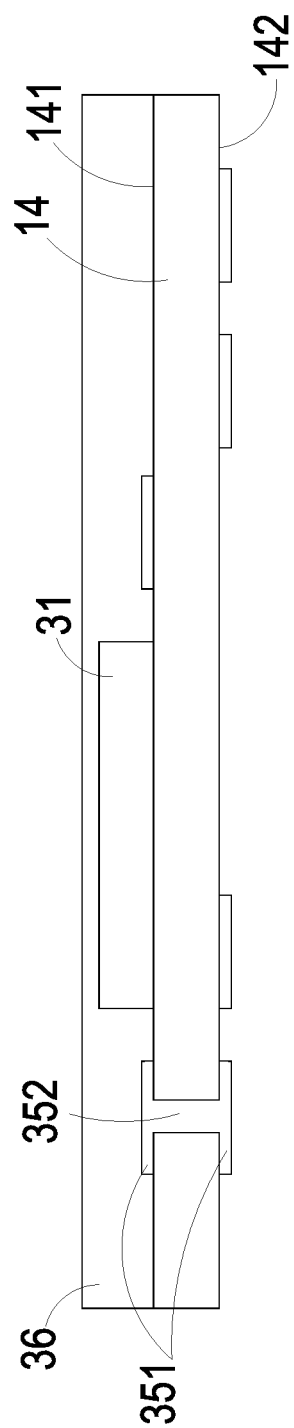
Figure 12C:
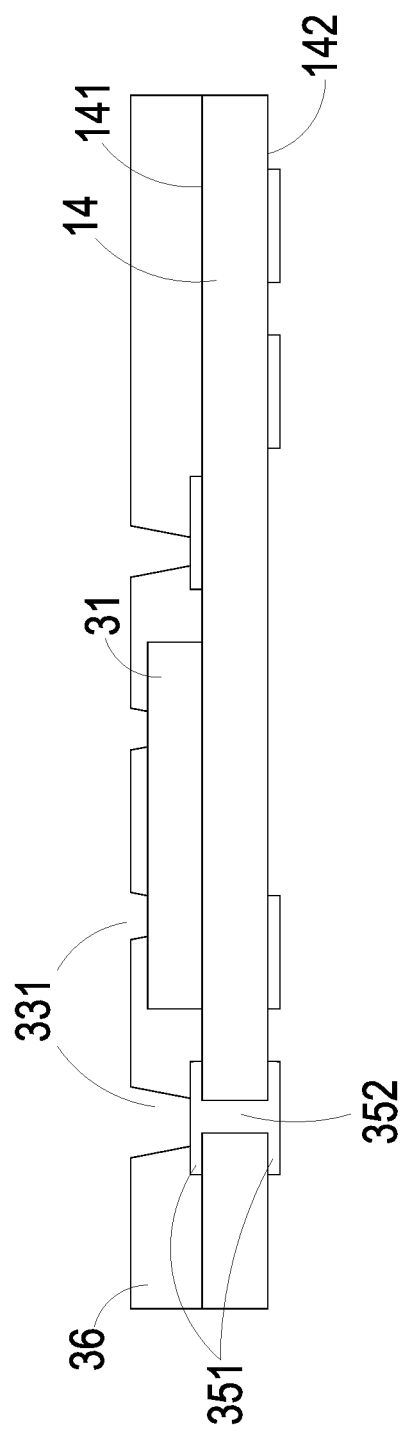
Figure 12D:
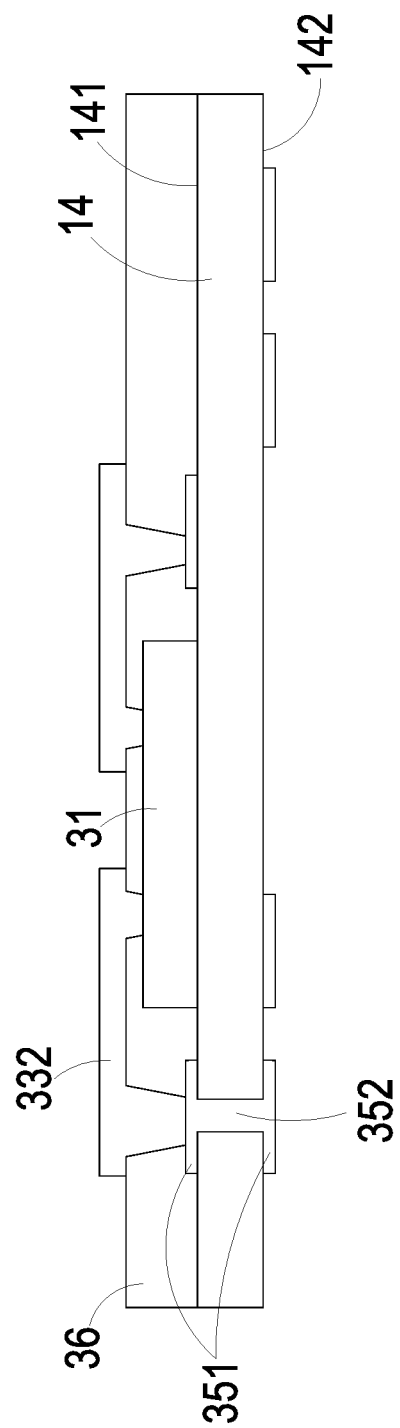

FIG. 11 is a schematic cross-sectional view illustrating a magnetic assembly according to a ninth embodiment of the present invention. FIGS. 12A to 12D schematically illustrate the structure of the magnetic assembly of FIG. 11 in different steps according to a manufacturing process of the present invention. In the embodiment, the structures, elements and functions of the magnetic assembly 5b are similar to those of the magnetic assembly 5 in FIG. 9, and are not redundantly described herein. Different from the magnetic assemble 5 of FIG. 9, the magnetic assembly 5b further includes an embedded electronic component 31. Firstly, as shown in FIG. 12A, the electronic component 31 is adhered and disposed on the second top surface 141 of the second magnetic core 14 having the second connecting wire 351 and the second connecting via 352. The second connecting wire 351 and the second connecting via 352 are formed by a method similar to that of the first upper winding set 121, the first lower winding set 122 and the first sidewall winding set 1231 of the first magnetic core 11 described in FIGS. 3A to 3C, and it is not redundantly described herein. Then, as shown in FIG. 12B, an insulating and packaging layer 36 is formed on the second top surface 141 of the second magnetic core 14 and covers the electronic component 31 by means of for example but not limited to heating. Then, a via 331 is formed by for example but not limited to laser drilling, so as to expose the portions of a first terminal of the electronic component 31 and the second connecting wire 351. Then, metal wires are formed and the via 331 is filled by a metallizing method for example but not limited to sputtering or electroplating, so as to form the connecting element 332, as shown in FIG. 12D. Finally, the second magnetic core 14 with the embedded electronic component 31 is adhered on the first magnetic core 11 having the first series winding 12, the first connecting wire 341, and the first connecting via 342. Similarly, the first connecting wire 341 is electrically connected to the second connecting wire 351 via a conductive material 19. In the embodiment, the electronic component 31 is integrated by means of embedding, so as to facilitate implementation of multilayer-circuit structure, optimize the electrical properties, and integrate more additional functions, for example but not limited to electromagnetic interference (EMI) shielding.

Figure 13:
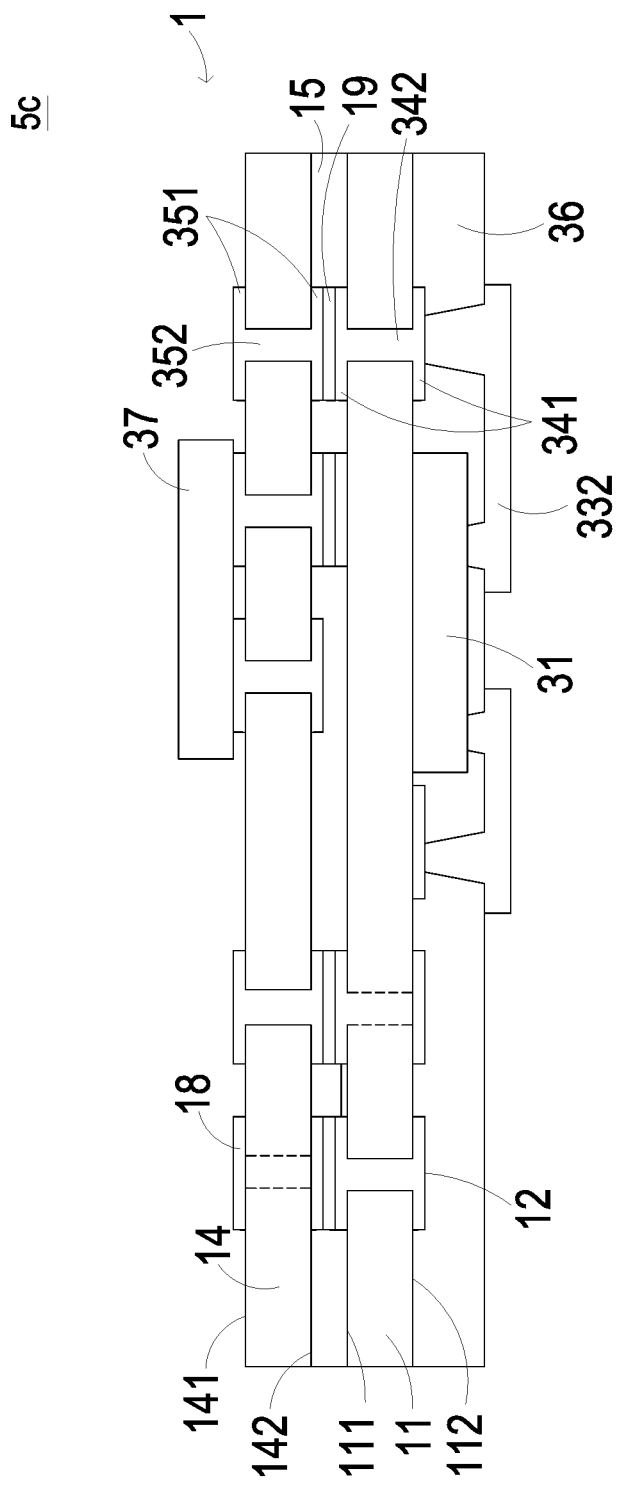
FIG. 13 is a schematic cross-sectional view illustrating a magnetic assembly according to a tenth embodiment of the present invention.

FIG. 13 is a schematic cross-sectional view illustrating a magnetic assembly according to a tenth embodiment of the present invention. In the embodiment, the structures, elements and functions of the magnetic assembly 5c are similar to those of the magnetic assembly 5b in FIG. 11, and are not redundantly described herein. Different from the magnetic assemble 5b of FIG. 11, the magnetic assembly 5c includes an embedded electronic component 31 disposed on the first bottom surface 112 of the first magnetic core 11. In addition, the layout of the second connecting wire 351 disposed on the second top surface 141 of the second magnetic core 14 is more flexible, and the second magnetic core 14 is capable of mounting more additional devices 37, for example but not limited to resistor, capacitor, control chip, driving chip or power device.

Figure 14:
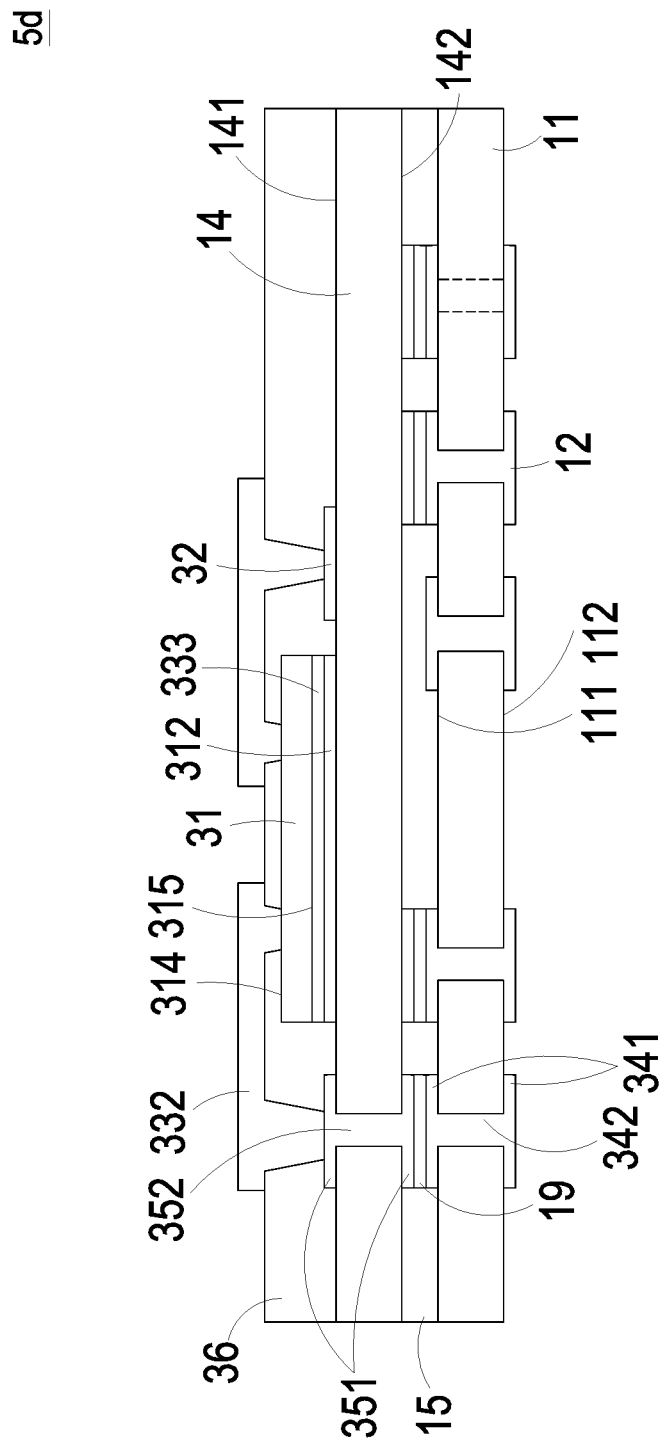
FIG. 14 is a schematic cross-sectional view illustrating a magnetic assembly according to an eleventh embodiment of the present invention.

FIG. 14 is a schematic cross-sectional view illustrating a magnetic assembly according to an eleventh embodiment of the present invention. In the embodiment, the structures, elements and functions of the magnetic assembly 5d are similar to those of the magnetic assembly 5b in FIG. 11, and are not redundantly described herein. Different from the magnetic assemble 5b of FIG. 11, the embedded electronic component 31 of the magnetic assembly 5d includes not only a connecting element 332 disposed on the top surface 314 for inputting or outputting, but also a second terminal (not shown) for inputting or outputting. The second terminal (not shown) is disposed on the bottom surface 315 of the electronic component 31 opposite to the second top surface 141 of the second magnetic core 14. The second terminal (not shown) is electrically connected to the conductive circuit 312 on the second top surface 141 of the second magnetic core 14 via the connecting element 333. Namely, the electronic component 31 includes the top surface 314 and the bottom surface 315 opposite to each other, and the bottom surface 315 of the electronic component 31 is adjacent to the second top surface 141 of the second magnetic core 14. In the embodiment, the first terminal (not shown) of the electronic component 31 is disposed on the top surface 314 and electrically connected to the conductive circuit 32 disposed on the second top surface 141 of the second magnetic core 14 via the connecting element 332. The second terminal (not shown) of the electronic component 31 is disposed on the bottom surface 315 and electrically connected to the conductive circuit 312 on the second top surface 141 of the second magnetic core 14 via the connecting element 333. The electronic component 31 is a switching device, such as a controllable switching device (i.e. MOSFET, SiC MOSFET, GaN HEMET, IGBT, etc.) or uncontrollable switching device (for example a diode). The switching device can be a planar component or a vertical component. In other embodiment, the electronic component 31 is a bare chip.

In summary, the present invention provides a magnetic assembly and a power module using the same. The magnetic assembly has the magnetic cores utilized as a substrate for wiring and different windings connected with each other in series or parallel for increasing the number of winding turns or decreasing the winding loss, so that structural supporting function is provided and the power module can have different insulating materials packaged on the magnetic cores of the magnetic assembly. Consequently, the occupied space of the power module relative to the system motherboard can be decreased so that the products with the power module are more competitive. In addition, sidewall through-holes are utilized to form at least one series winding on the magnetic cores. Accordingly, plural magnetic assemblies can be constructed by a large-size magnetic substrate at the same time so as to simplify the manufacturing process and avoid a waste of space utilized in the magnetic assembly by the structure of sidewall through-holes. On the other hand, the magnetic assembly is constructed by two magnetic cores, and an adhesive material is disposed between two magnetic cores and has a thickness corresponding to the practical requirements of the power module, so as to adjust the magnetic property of the magnetic assembly and increase the design variability. Multi surfaces are provided for wiring in multilayers and facilitating to optimize the circuit characteristics and integrate more functions in the power module. For constructing a buck circuit in different embodiments, the combination of switching devices and the inductors is not limited to plural switching devices with one inductor, one switching device with plural inductors or plural switching devices with plural inductors. In the present invention, the power module can have the windings, the connecting wires, the connecting vias and the insulating materials integrated and adjusted according to the design. When plural inductors are implanted, plural separate inductors or coupled inductors can be accomplished by means of designing the wiring pattern.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A magnetic assembly comprising:
   a first magnetic core having a first top surface, a first bottom surface, a first sidewall, a second sidewall, at least one first sidewall through-hole and at least one second sidewall through-hole, wherein the at least one first sidewall through-hole is disposed on the first sidewall, the at least one second sidewall through-hole is disposed on the second sidewall, and the first sidewall is opposite to the second sidewall;
   a second magnetic core having a second top surface and a second bottom surface, wherein at least a portion of the second bottom surface of the second magnetic core is connected to the first top surface of the first magnetic core by an adhesive layer; and
   at least a first series winding having a first upper winding set, a first sidewall winding set, and a second sidewall winding set, wherein the first upper winding set is disposed on the first top surface, the first sidewall winding set is disposed in the first sidewall through-hole, the second sidewall winding set is disposed in the second sidewall through-hole, the first upper winding set is electrically connected to the first sidewall winding set and the second sidewall winding set, so as to form the first series winding around the first magnetic core.

2. The magnetic assembly according to claim 1, wherein the first series winding further comprises a first lower winding set disposed on the first bottom surface of the first magnetic core, the first upper winding set is electrically connected to the first lower winding set via the first sidewall winding set, and the second sidewall winding set is electrically connected to the first lower winding set, so as to form the first series winding around the first magnetic core.

3. The magnetic assembly according to claim 1, wherein the first magnetic core or the second magnetic core further comprises at least an air gap.

4. The magnetic assembly according to claim 1, wherein the first magnetic core or the second magnetic core further comprises a through hollow section formed by a non-magnetic and insulating material and configured to form a non-magnetic zone.

5. The magnetic assembly according to claim 1, wherein the first magnetic core comprises an insulating layer disposed on and covering the first top surface, the first bottom surface, the at least one first sidewall through-hole and the at least one second sidewall through-hole, so as to insulate the first magnetic core from the first series winding.

6. The magnetic assembly according to claim 1, further comprising:
   an insulating dielectric layer disposed on the first series winding; and
   an additional winding disposed on the insulating dielectric layer and electrically connected to the first series winding in parallel or series.

7. The magnetic assembly according to claim 1, wherein the first series winding set has a metallic layer disposed on the first magnetic core.

8. The magnetic assembly according to claim 1, wherein the second magnetic core is a magnetic conductive gel disposed on the first top surface of the first magnetic core.

9. The magnetic assembly according to claim 1, wherein the second magnetic core further comprises a third sidewall, a fourth sidewall, at least a third sidewall through-hole and at least a fourth sidewall through-hole, wherein the third sidewall through-hole is disposed on the third sidewall, the fourth sidewall through-hole is disposed on the fourth sidewall, and the third sidewall is opposite to the fourth sidewall.

10. The magnetic assembly according to claim 9, wherein the second magnetic core further comprises a second series winding having a second upper winding set, a second lower winding set, a third sidewall winding set and a fourth sidewall winding set, wherein the second upper winding set is disposed on the second top surface of the second magnetic core, the second lower winding set is disposed on the second bottom surface of the second magnetic core, the third sidewall winding set is disposed on the third sidewall through-holes of the second magnetic core, the fourth sidewall winding set is disposed on the fourth sidewall through-holes of the second magnetic core, the second upper winding set is electrically connected to the second lower winding set via the third sidewall winding set, and the fourth sidewall winding set is electrically connected to the second lower winding set, so as to form the second series winding around the second magnetic core.

11. The magnetic assembly according to claim 10, wherein the second magnetic core comprises an insulating layer disposed on and covering the second top surface, the second bottom surface, the third sidewall through-holes and the fourth sidewall through-holes, so as to insulate the second magnetic core from the second series winding.

12. The magnetic assembly according to claim 10, further comprising:
an insulating dielectric layer disposed on the second series winding; and
an additional winding disposed on the insulating dielectric layer and electrically connected to the second series winding in parallel or series.

13. The magnetic assembly according to claim 10, further comprising a conductive layer disposed between the first series winding and the second series winding so as to connect the first series winding and the second series winding in parallel or series.

14. The magnetic assembly according to claim 10, further comprising:
an electronic component disposed on the first magnetic core or the second magnetic core; and
a conductive circuit disposed on the first magnetic core or the second magnetic core and electrically connected with the electronic component.

15. The magnetic assembly according to claim 14, wherein the electronic component is deposed on the first magnetic core or the second magnetic core, and the magnetic assembly comprises an insulating and packaging layer covering the electronic component, wherein the electronic component is electrically connected to the conductive circuit of the first magnetic core or the second magnetic core via a bonding wire.

16. The magnetic assembly according to claim 14, wherein the electronic component is deposed on the first magnetic core or the second magnetic core, and the magnetic assembly comprises:
an insulating and packaging layer covering the electronic component and exposing a first terminal of the electronic component disposed on the conductive circuit of the first magnetic core or the second magnetic core; and
a connecting element electrically connected between the first terminal and the conductive circuit of the first magnetic core or the second magnetic core.

17. The magnetic assembly according to claim 16, wherein the electronic component further comprises a second terminal disposed between the electronic component and the first magnetic core or the second magnetic core.

18. The magnetic assembly according to claim 14, wherein the electronic component is a bare chip.

19. The magnetic assembly according to claim 1, further comprising:
an electronic component disposed on the first magnetic core or the second magnetic core; and
a conductive circuit disposed on the first magnetic core or the second magnetic core and electrically connected with the electronic component.

20. The magnetic assembly according to claim 19, wherein the electronic component is deposed on the first magnetic core or the second magnetic core, and the magnetic assembly comprises an insulating and packaging layer covering the electronic component, wherein the electronic component is electrically connected to the conductive circuit of the first magnetic core or the second magnetic core via a bonding wire.

21. The magnetic assembly according to claim 19, wherein the electronic component is deposed on the first magnetic core or the second magnetic core, and the magnetic assembly comprises:
an insulating and packaging layer covering the electronic component and exposing a first terminal of the electronic component disposed on the conductive circuit of the first magnetic core or the second magnetic core; and
a connecting element electrically connected between the first terminal and the conductive circuit of the first magnetic core or the second magnetic core.

22. The magnetic assembly according to claim 21, wherein the electronic component further comprises a second terminal disposed between the electronic component and the first magnetic core or the second magnetic core.

23. The magnetic assembly according to claim 19, wherein the electronic component is a bare chip.

* * * * *